United States Patent [19]

Rubertus et al.

[11] Patent Number: 4,482,874

[45] Date of Patent: Nov. 13, 1984

[54] METHOD OF CONSTRUCTING AN LC NETWORK

[75] Inventors: Roland W. Rubertus, New Brighton; William C. Tait, Oak Park Heights, both of Minn.

[73] Assignee: Minnesota Mining and Manufacturing Company, St. Paul, Minn.

[21] Appl. No.: 385,008

[22] Filed: Jun. 4, 1982

[51] Int. Cl.³ .................. H03H 1/00; H03H 3/00; H03H 7/01

[52] U.S. Cl. ................. 333/185; 29/602 R; 156/233; 156/267; 336/205; 336/232; 333/138; 333/140; 333/175

[58] Field of Search ................. 333/167–185, 333/138–140; 156/233, 267; 29/602 R, 829–832, 835, 847, 856, 855, 883; 336/200, 205, 232, 69; 361/401, 402, 404, 409

[56] References Cited

U.S. PATENT DOCUMENTS

| | | | |
|---|---|---|---|
| 838,423 | 12/1906 | Kitsee | 336/200 X |
| 2,832,935 | 4/1958 | Tank | 333/140 |
| 3,161,945 | 12/1964 | Anderson | 29/155.5 |
| 3,301,730 | 1/1967 | Spiwak | 156/267 |
| 3,419,834 | 12/1978 | McKechnie | 336/69 |
| 3,497,410 | 2/1970 | Zagusta | 156/233 |
| 3,536,545 | 10/1970 | Traynor | 156/3 |
| 3,547,724 | 12/1970 | Zagusta | 156/233 |
| 3,616,039 | 10/1975 | Hutzler | 156/309 |
| 3,701,958 | 10/1972 | Jaag | 333/185 |
| 3,913,219 | 10/1975 | Lichtblau | 361/402 |
| 4,021,705 | 5/1977 | Lichtblau | 361/402 |
| 4,203,081 | 5/1980 | Braeckelmann | 333/138 |

FOREIGN PATENT DOCUMENTS

| | | |
|---|---|---|
| 1073046 | 1/1960 | Fed. Rep. of Germany . |
| 1156131 | 10/1963 | Fed. Rep. of Germany . |
| 1226182 | 10/1966 | Fed. Rep. of Germany . |
| 711223 | 9/1931 | France . |
| 2412923 | 7/1979 | France . |
| 1138628 | 1/1969 | United Kingdom . |

OTHER PUBLICATIONS

Hudson–"Design of Printed Circuit Coils", Q.S.T. Amateur, vol. 54, No. 4, Apr. 1970; p. 44.

*Primary Examiner*—Marvin L. Nussbaum
*Attorney, Agent, or Firm*—Donald M. Sell; James A. Smith; William B. Barte

[57] ABSTRACT

A method of constructing an inductive-capacitive (LC) network is disclosed in which a predetermined pattern is cut from a metallic sheet to provide a multi-turn, essentially spiral-like configuration in which a plurality of interconnecting regions are left between adjacent turns. A pre-laminate is then formed by laminating one surface of the configured sheet to a surface of a sheet of dielectric material. A completed multi-turn inductor is formed by a second cutting operation in which the remaining interconnecting regions between the adjacent turns are removed. The LC network is completed by laminating a second metallic sheet to a dielectric layer overlying the completed multi-turn inductor. The first and second cutting operations and assembly of the respective sheets are performed such that any burrs resulting from the operations are directed away from the interlying sheet of dielectric material, thereby avoiding problems due to shorting out between the two metallic sheets.

17 Claims, 6 Drawing Figures

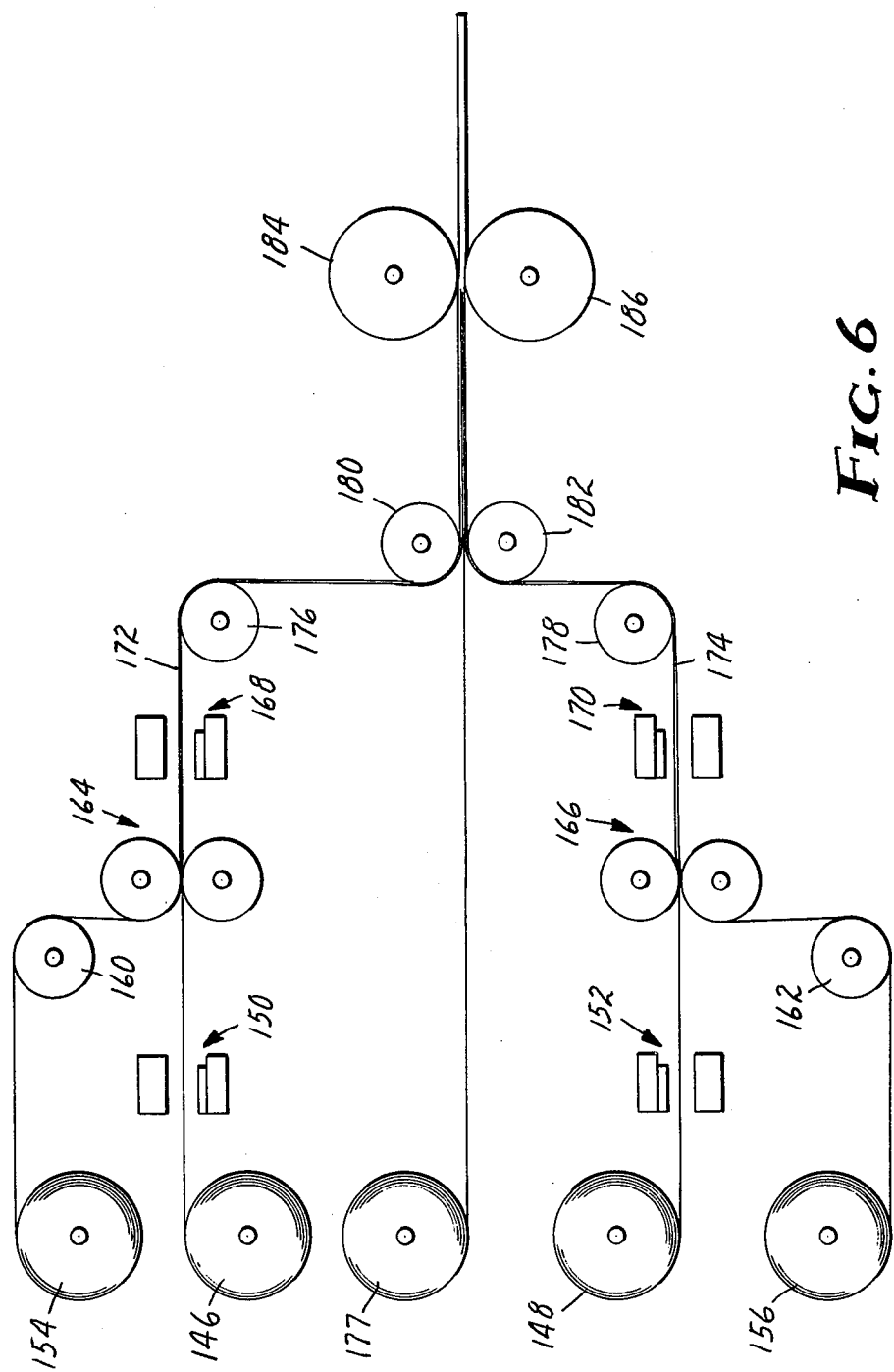

METHOD OF CONSTRUCTING AN LC NETWORK

BACKGROUND OF THE INVENTION

Electrical circuits including inductive and capacitive networks (LC networks) are known for use in such functions as creating a time delay for an electrical signal or forming a tank circuit having a specific resonant frequency. Substantially planar, resonant frequency circuits are typically provided for use as detectable tags in antipilferage systems. Presently, such LC networks are formed by such methods as installing discrete inductors and capacitors; or by etching conductive paths in the shape of inductive coils on an insulating substrate and adding either discrete capacitors or capacitive pads on the same substrate (see for example U.S. Pat. No. 4,021,705), both of which are labor intensive, and therefore costly. Because of the prominence of these LC networks within electrical circuits, it is highly desirable to have a low cost, and yet reliable method of manufacture for these networks.

In a co-pending patent application, Ser. No. 256,934, filed Apr. 23, 1981, by one of the present inventors, W. C. Tait, together with Lanny L. Harklau, one such simplified and low-cost method of manufacturing LC networks is disclosed. That method comprises cutting, punching and removing a predetermined pattern from a first conductive sheet, typically a conductive foil. What remains of the conductive sheet after this first cutting operation is a conductive path having an essentially coil-like configuration of windings, with a plurality of interconnections between the adjacent windings which are purposely left by the first cutting operation to add rigidity and thereby cause the conductive sheet to remain planar and essentially self supporting. A similar cutting and removing operation is also performed on a second conductive sheet resulting in a conductive path having an essentially coil-like configuration, and also having a plurality of interconnections between the adjacent windings wherein the conductive sheet remains intact. The self-supporting nature of these conductive paths facilitates their handling in the next method step, when at least one capacitor is formed by orienting and laminating the first and the second conductive sheets to opposing faces of a non-conductive, dielectric sheet with at least one portion of the conductive path on the first conductive sheet substantially aligned with at least one portion of the conductive path on the second conductive sheet, but with the aligned portions separated from each other by the non-conductive dielectric sheet. With the added strength of the non-conductive sheet within the lamination, at least one inductor can now be formed by cutting and removing a predetermined pattern from the lamination, thereby eliminating at least some of the interconnections between the adjacent windings formed by each of the conductive sheets. What remains is at least two continuous conductive paths separated by a non-conductive layer, thus forming the LC network.

Since the LC network invention is entirely formed by simple cutting and laminating operations, the manufacturing cost is kept desirably low.

SUMMARY OF THE INVENTION

It has now been determined that while the method disclosed in U.S. Ser. No. 256,934 is desirably simple and low cost, a major drawback exists, in that burrs are often encountered during the respective die-cutting operations. Particularly after the conductive sheets are laminated together with an interlieing dielectric sheet and at least some interconnecting portions are removed, burrs from one conductive sheet have been found to occasionally pierce through the dielectric sheet and electrically short out the formed capacitor. The present invention is thus directed to an improved method of manufacturing LC networks and to the LC networks per se, so formed. The method of the present invention, while involving an additional step, and hence being somewhat more costly, is particularly advantageous in that defective "short-circuited" tags are eliminated.

The method of the present invention of constructing a substantially planar inductive-capacitive (LC) network thus comprises applying a cutting means, such as the male portion or punch of a zero-clearance punch and die assembly, to a first surface of a first conductive metallic sheet to cut therefrom a discontinuous predetermined pattern, forming therein a multi-turn, essentially spiral-like configuration having a plurality of interconnecting regions between adjacent turns of the spiral-like configuration. The remaining interconnecting regions thus add rigidity to the configured sheet. Burrs typically resulting from the cutting or punching operation extend from the surfaces of the metallic sheet opposite that at which the punch member is applied.

In a second step, a pre-laminate is formed by laminating one surface of the configured sheet to one surface of a sheet of dielectric material. Preferably, in one embodiment, the dielectric sheet will be laminated to the first, i.e., burr-free, surface of the metallic sheet. As a third step, a substantially planar, multi-turn inductor is completed by applying a second cutting means, such as the male section or punch of another zero-cearance punch and die assembly, to the pre-laminate to remove therefrom another discontinuous predetermined pattern which includes most of the interconnecting regions between the adjacent turns in the configured metallic sheet, leaving at least one continuous portion of the spiral-like configuration with no interconnecting regions, and to cause burrs resulting from the second cutting operation to also extend from the opposite surface of the metallic sheet. In contrast to the continuous spiral-like path left in the metallic sheet, the dielectric sheet is left with a discontinuous predetermined pattern, namely a plurality of discontinuous elongated apertures, and thus has appreciable structural integrity which provides rigidity to the pre-laminate.

The final step in constructing the substantially planar LC network includes forming a final laminate by laminating a second conductive sheet to a dielectric layer overlying the first surface of the first metallic sheet, the second metallic sheet being aligned with the multi-turn inductor. The resultant sandwich of the second metallic sheet, dielectric layer, and multi-turn inductor thus forms a distributed capacitor which combines with the multi-turn inductor to provide the substantially planar LC network. By utilizing a dielectric layer overlying the first, i.e, burr-free, surface of the first metallic sheet in which the multi-turn inductor is formed, any burrs present are directed away from the dielectric layer, and hence also away from the second metallic sheet, thus eliminating the possibility of short-circuits due to burrs extending through the dielectric layer to contact the second metallic sheet.

In the preferred embodiment in which the pre-laminate formed in the second step discussed above includes the dielectric sheet laminated to the first, or burr-free, surface of the first metallic sheet, that dielectric sheet itself may be utilized as the dielectric layer in the final laminate, such that the second metallic sheet need only be laminated to the exposed surface of the dielectric sheet.

Analogously, in an embodiment in which the LC network desirably includes two substantially planar, multi-turn inductors with a dielectric layer sandwiched therebetween, the second metallic sheet may be converted into a second inductor included within a second pre-laminate by following the first three steps noted above. Also, where the dielectric sheet of the second pre-laminate is also applied to the first, or burr-free, surface of the metallic sheet in the second pre-laminate, the final laminate resulting in the LC network may be conveniently formed by fusing together the dielectric sheets of the two pre-laminates. Thus, for example, if similar thermoplastic compositions are used in each of the dielectric sheets, the two sheets forming the dielectric layer in the final laminate may appear to be a single sheet, resulting in a structure virtually indistinguishable from that disclosed in the earlier acknowledged co-pending application Ser. No. 256,934, but in which the problem of short-circuits is avoided.

BRIEF DESCRIPTION OF THE DRAWING

FIG. 6 is an illustration of an alternative method of manufacturing an LC network according to the present invention.

DESCRIPTION OF THE PREFERRED EMBODIMENTS

Figure 1:
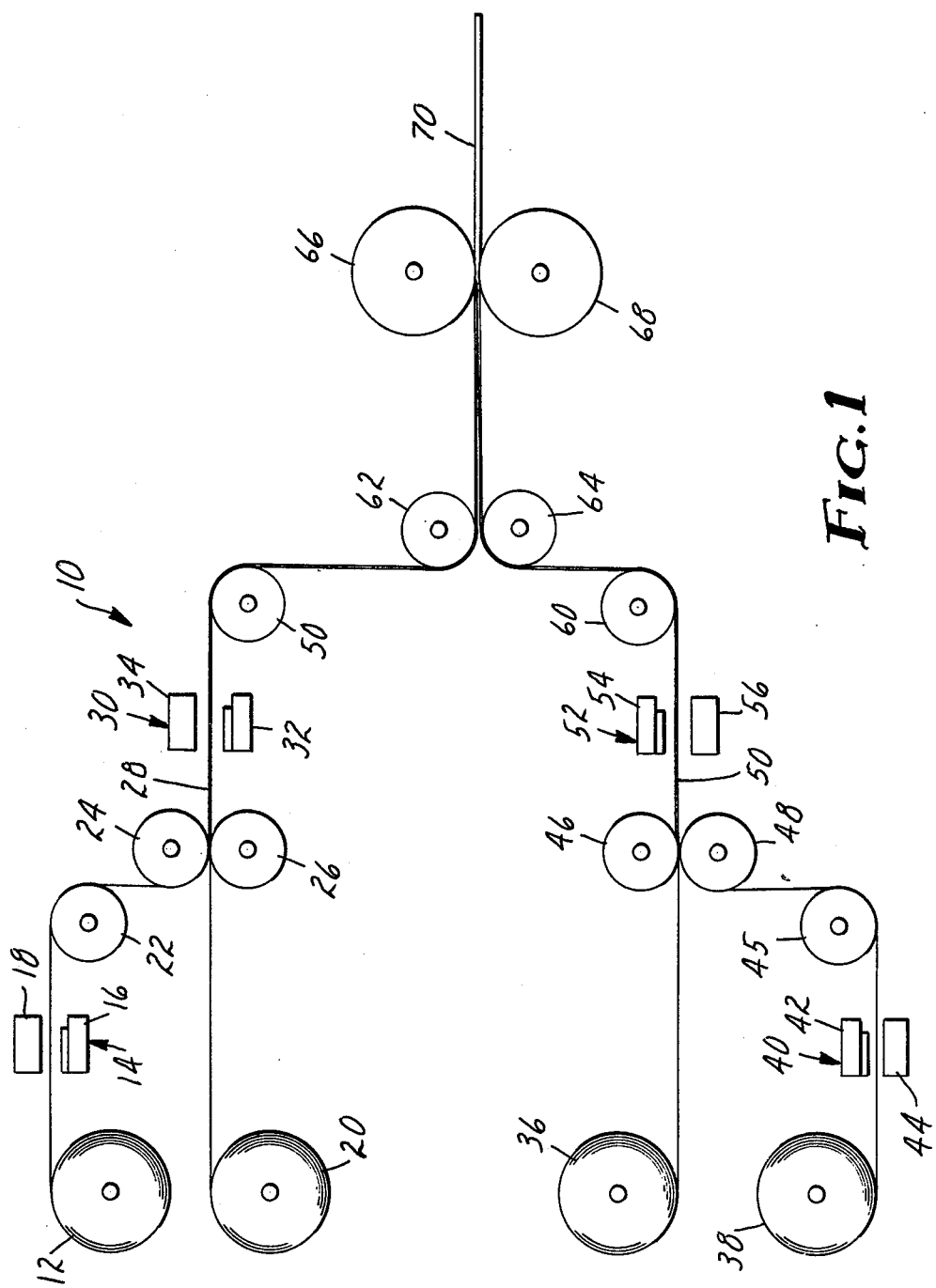
FIG. 1 is an illustration of one method of manufacturing an LC network according to the present invention.

A preferred method of manufacturing LC networks according to the present invention is generally illustrated in FIG. 1. As there shown, the method involves the simple and conventional operations of die cutting and laminating, which method is adaptable to the automated manufacture of LC networks and is therefore capable of purporting a reduction in the cost relative to other prior art methods. The method according to the present invention utilizes conventional die cutting presses with associated male and female punch and die assemblies, together with conventional laminating means. As set forth in the left hand portion of FIG. 1, the first stage in the method involves the formation of two separate pre-laminates 28 and 50, respectively, each of which comprises a layer of a metal sheet together with a dielectric sheet. Thus, in forming the first pre-laminate 28, there is provided a roll of a metal sheet such as a roll of aluminum foil 12. Similar materials, such as copper, having a range of thicknesses varying from 0.02 millimeters to 0.10 millimeters may also be utilized. The aluminum roll is then passed through a die cutting station 14, which includes a male punch member 16 and a female die member 18. The punch and die have a pattern such that upon application to the aluminum sheet, there is removed from the aluminum sheet a predetermined discontinuous pattern, leaving behind a conductive path having an essentially coil-like configuration containing a plurality of windings with a plurality of interconnections between the adjacent windings wherein the conductive sheet remains in tact. It will be recognized that with the punch member 16 of the punch and die assembly 14, directed to the under surface of the aluminum sheet, burrs resulting from the punching operation will be caused to project from the upper surface of the aluminum sheet. The nature of the multi-turn, coil-like configuration together with the projecting burrs, is shown in more detail in FIG. 2 to be discussed hereafter.

The second layer of the pre-laminate 28 is formed from a roll of dielectric material such as a roll of polyethylene 20. It will be appreciated that a large variety of various dielectric materials may similarly be utilized, such as electrical grade paper and other polymeric compositions typically utilized in electrical or capacitor applications. Where a roll of polyethylene is utilized, it may be desired to provide a primed top surface, such as by corona treatment, to enhance the adherence of the polyethylene sheet to the aluminum sheet as described hereinafter. The aluminum and polyethylene rolls 12 and 20, respectively, are thence brought together via guide roller 22 and passed between pressure rollers 24 and 26, thus forming the first pre-laminate 28.

The pre-laminate 28 is then passed through a second die cutting station 30, which station includes a second punch member 32 and an associated die 34. The second cutting operation eliminates the interconnections between the conductive paths previously cut in the aluminum sheet during the first cutting operation at the station 14 and thus completes a multi-turn inductor. On the other hand, the dielectric sheet 20 is left with a plurality of discontinuous elongated apertures corresponding to the removed interconnections in the aluminum sheet while remaining intact in areas corresponding to the portions removed from the aluminum sheet during the first cutting operation, and thus has appreciable structural integrity to provide rigidity to the finally formed pre-laminate.

As further shown in FIG. 1, a second pre-laminate is similarly formed from a roll of metal foil 38, such as a roll of aluminum, and a roll of dielectric material 36, such as a corona treated roll of polyethylene. In like manner to that discussed above, the aluminum roll 38 is first passed by a die cutting station 40 which includes a male punch member 42 and matching die 44, the operation of which removes a discontinuous predetermined pattern from the aluminum sheet, resulting in the aluminum sheet a multi-turn, essentially spiral-like configuration, having a plurality of interconnecting regions between adjacent turns of the spiral-like configuration, just as resulted from the die-cutting operation in station 14, onto the aluminum sheet 12. Similarly, the male punch member 42 being punched through the aluminum sheet 38 into the female die member 44 will cause burrs to protrude from the lower surface of the aluminum sheet.

Again, in like manner to the formation of the first pre-laminate 28, the aluminum sheet 38 is then directed around a guide roller 45 and is laminated to the polyethylene sheet 36 by means of the pressure rollers 46 and 48. The resulting pre-laminate 50 is passed through a second die cutting station 52 made up of a male punch member 54 and a corresponding female die member 56. The operation of the second punching assembly 52 removes from the pre-laminate 50 another discontinuous predetermined pattern which includes the interconnecting regions between the adjacent turns formed in the aluminum sheet 38 during the operation of the first die cutting station 40, and thus leaves within the aluminum sheet 38 of the pre-laminate 50 at least one continuous portion of the spiral-like configuration with no interconnecting regions thereby completing another multi-turn inductor. In both the pre-laminates 28 and 50, burrs resulting during the operation of the second die-cutting stations 30 and 52 extend through the outward facing surfaces of the aluminum sheets. As with the pre-laminate 28, while a continuous spiral-like path results in the aluminum sheet 38, the dielectric sheet 36 is left with a plurality of discontinuous elongated apertures correponding to the removed interconnections in the aluminum sheet 38, while remaining intact in areas corresponding to the portions removed from the aluminum sheet during the operation of the first die cutting station 40, and thus has appreciable structural integrity to provide rigidity to the finally formed pre-laminate 50.

In a final stage of the method, the two pre-laminates are directed around guide rollers, such as rollers 58, 60, 62 and 64, and are thence directed through pressure rollers 66 and 68 to fuse the dielectric layers together, thereby forming the final laminate 70 which includes an inductive-capacitive (LC) network including the multi-turn inductors formed as an integral part of each of the pre-laminates, together with a capacitor formed as the result of the dielectric layers being sandwiched between the multi-turn inductors. The final formed laminate 70 is then coupled to a converter (not shown) within which, for example, the individual LC circuits may be partially die cut and/or assembled on a carrier liner for ready use by the ultimate consumer.

Figure 2:
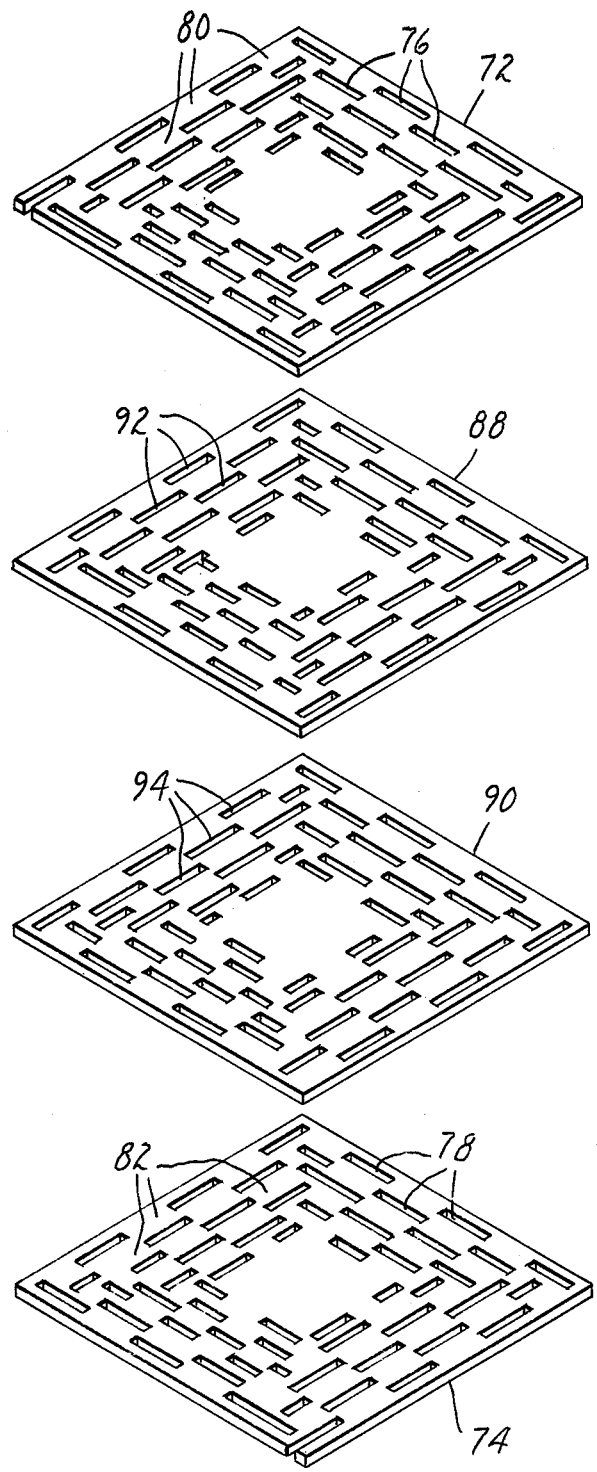
FIG. 2 is an exploded view of the various layers of one laminate formed during the manufacture of the LC network according to the method of the present invention shown in FIG. 1.

An exploded view of the LC network provided by the method illustrated in FIG. 1 is set forth in FIG. 2. As there shown, the predetermined patterns punched outwardly into the aluminum sheets 72 and 74 at the first die cutting stations 14 and 40 shown in FIG. 1, result in the formation in the aluminum sheets of a spiral-like discontinuous pattern consisting of a series of elongated apertures 76 and 78 of the aluminum sheets 72 and 74, respectively, which are separated by interconnecting regions 80 and 82, respectively. It will be appreciated that burrs resulting from the two stamping operations will thus project from outer facing surface of the two respective sheets and thereby face away from each other and away from any dielectric layer to be sandwiched therebetween.

Prior to passing through the second die cutting stations 30 and 52 shown in FIG. 1, pre-laminates 28 and 50 are formed by laminating the aluminum sheets 72 and 74 to the polyethylene sheets 88 and 90, respectively, shown in FIG. 2. For purposes of clarity, these respective layers are shown separated and in different stages of processing, the aluminum sheets 72 and 74 being depicted as punched by the first die cutting stations 14 and 40, while the polyethylene sheets are depicted as punched by the second die cutting stations 30 and 52. Upon passing through the second die cutting stations 30 and 52, respectively, each of the pre-laminates 28 and 50 has cut therein a second discontinuous predetermined pattern, resulting in the removal of the discontinuous interconnecting regions 80 and 82 from the aluminum sheets and leaves within the polyethylene sheets 88 and 90 elongated discontinuous apertures 92 and 94. The two thus completed pre-laminates are then laminated together such as via the pressure rollers 66 and 68 shown in FIG. 1, to complete the substantially planar LC network of the present invention.

Figure 3:
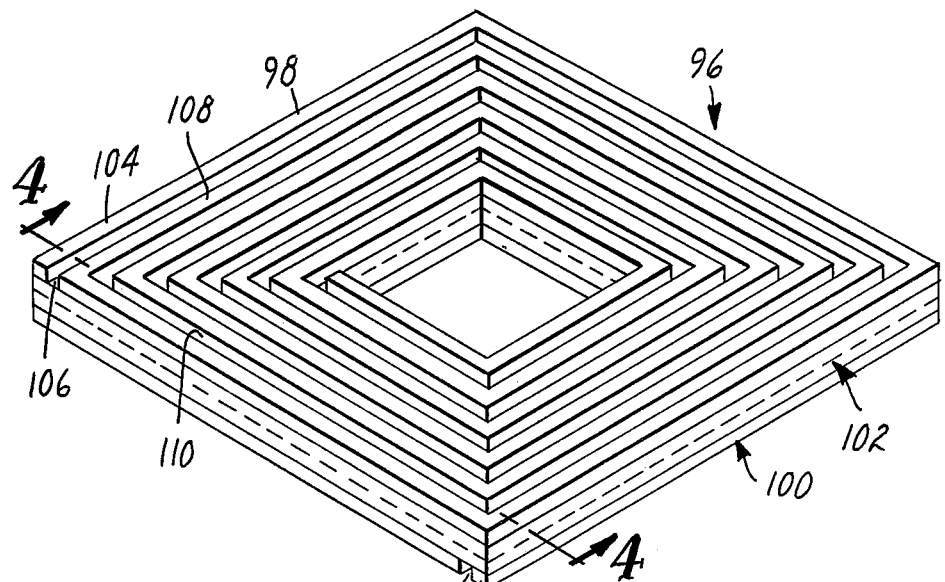
FIG. 3 is a perspective view of one LC network according to the present invention.

The final laminate 96 formed via the operation shown in FIG. 1 is set forth in perspective view in FIG. 3. In the preferred embodiment there shown, the multi-turn winding formed in the top aluminum layer 98 has essentially a square configuration having six turns. In a preferred embodiment wherein the external dimensions of the laminate are about 5 centimeters by 5 centimeters, each leg of the turns has a width of approximately 1 millimeter and a space between adjacent legs of approximately 0.75 millimeter. The multi-turn winding formed in the bottom aluminum layer 100 is similarly dimensioned. The two dielectric layers, formed from the polyethylene rolls 20 and 36 shown in FIG. 1, are shown in FIG. 3 as a single dielectric layer 102, as the individual layers 20 and 36 having lost their individuality upon being fused together between the pressure rollers 66 and 68. Accordingly, only a dashed line representing the original boundary is shown in FIG. 3.

Figure 4:
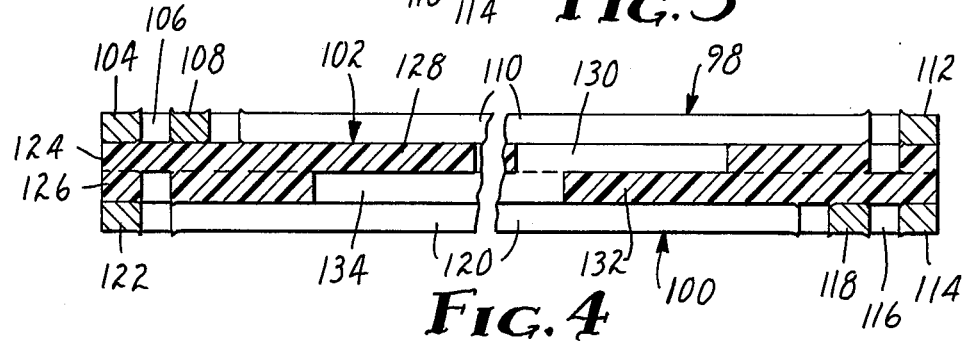
FIG. 4 is a transverse sectional view taken along line 4—4 of FIG. 3.

A cross section of the resultant laminate 96, taken along the lines 4—4, is shown in FIG. 4. As may be seen along that section line as well as in FIG. 3, the top layer 98 includes a first leg 104 of the first turn of the resultant multi-turn winding, a cut-away portion 106, a leg of the second turn 108 of the winding, an extended cutaway portion 110 representing the cut-away portion between the first and second turns, respectively, and the opposite leg 112 of the first turn. Similarly, the bottom layer 100 includes a leg 114 of the first turn, an opening between that leg and the adjacent turn 116, a leg 118 of a second turn, an extended cut-away portion 120 representing the removed portion between another leg of the first and second turns, and the opposite leg 122 of the first turn. The interlying dielectric layer 102 may also be seen to have an upper half 124 and a lower half 126, each of which is provided by the polyethylene layers 88 and 90 of FIG. 2 respectively. The upper half 124 includes portions 128 which remain after the second cutting operation within the die cutting station 30 shown in FIG. 1, and a plurality of cut-away sections 130 which were removed during the operation at the second die cutting station 30 in FIG. 1. It will be noted that, for example, the portion 106 within the top layer 98 was removed from the aluminum sheet 12 during the operation of the first cutting station 14, while the portion 110 of the aluminum sheet directly above the removed portion 130 of the upper portion 124 of the dielectric layer was removed simultaneously with the removal of the portion 130 during the operation in the second cutting station 30. Similarly, the lower portion 126 of the dielectric layer 102 includes a plurality of sections 132 interspersed by removed portions 134, which portions were removed during the operation of the second die cutting station 52.

Figure 5:
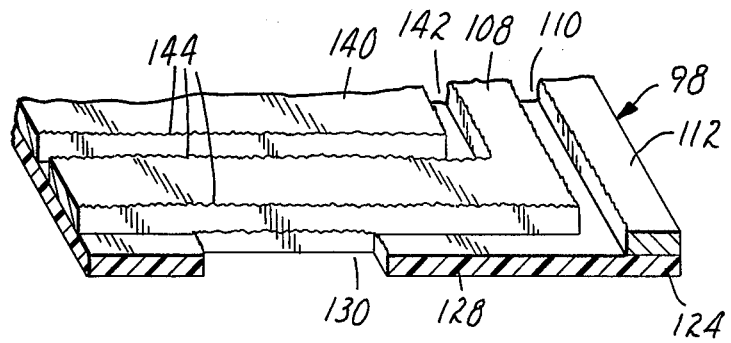
FIG. 5 is a partial perspective view of a portion of LC network shown in FIG. 3.

A partial perspective view of the inductor formed within the top layer 98 and the upper portion 124 of the dielectric layer 102 is further shown in FIG. 5, the leading edge of the perspective view being taken along the line 4—4 of FIG. 4. It may there be seen that the leg 112 is separated from the adjoining leg 108 of the next turn by a cut-away portion 110, the next inner turn 140 being similarly separated from the second turn 108 by a cut-away portion 142. Also, the dielectric layer 124 below the cut-away portion 110 between the first and second turns may be seen to include a first portion 128 which remains, notwithstanding the removal of the overlying aluminum layer during the operation of the first cutting station 14, and a second portion 130, which was removed during the operation of the second cutting station 30. Burrs 144 provided on the edges of each of the turns of the aluminum layer 98 may further be seen in FIG. 5 to extend away from the dielectric layer 124 so as to avoid any tendency to short out to the lower aluminum layer 100.

A further embodiment for constructing the substantially planar LC networks according to the present invention is set forth in FIG. 6. In the embodiment there shown, the resultant laminate is a 5-layered construction, including two metal layers sandwiched between outer dielectric layers and an innermost dielectric layer. As there shown, two metal rolls, such as rolls of aluminum foil 146 and 148, are provided. Each roll is subjected to a first punching operation within one of the pair of punches and dies, 150 and 152, respectively. Each of the sets of punches and dies removes from the respective metal roll a discontinuous predetermined pattern resulting in a conductive path having an essentially spiral-like configuration and in which there are also a plurality of innerconnections between adjacent windings wherein the conductive metallic sheet remains intact, such as shown in FIG. 2. The male, or punch, portion of the punch and die assemblies, 150 and 152, are here arranged such that any burrs resulting during the punching operation project from the outer surface of the aluminum sheets. The outer surface of the aluminum sheets 146, 148 are then laminated to a dielectric sheet such as provided from rolls of polyethylene 154 and 156, respectively, those rolls being coupled via guide rolls 160 and 162, to bring the polyethylene sheets into contact with the outer surface of the aluminum rolls 146 and 148 whence they are laminated together by means of sets of pressure rollers 164 and 166, in like manner to that shown in FIG. 1. As discussed in conjunction with that figure, the surface of the polyethylene to be laminated to the aluminum sheets may be preferably treated such as by corona discharge to enhance the adherence to the aluminum sheet.

After passing through the pressure rollers 164 and 166, such that a pair of pre-laminates are formed, another die cutting operation is performed on each pre-laminate by means of two more sets of punch and die assemblies 168 and 170, in like manner to that performed by the punch and die assemblies 30 and 52 shown in FIG. 1. These assemblies remove a second discontinuous pattern from the pre-laminates such as to remove the innerconnections between the spiral-like multi-turn winding left in the aluminum sheets 146 and 148, while leaving a plurality of discontinuous elongated apertures in the overlying dielectric polyethylene sheets 154 and 156 which add appreciable structural integrity to the resultant pre-laminates 172 and 174. Again, as in the case of the punch and die members 150 and 152, the punch and die members 168 and 170 are arranged such that any burrs resulting from the second punching operations are directed outward, so as to avoid shorting out the metallic multiturn coils once finally laminated with an interlying dielectric layer. Such a dielectric layer is included in the embodiment shown in FIG. 6 by a third roll of polyethylene 177. The polyethylene roll 177 is brought between the two rolls of the two pre-laminates 172 and 174 via guide rolls 176, 178, 180 and 182, and the final laminate then formed by passing the combined layers between pressure rollers 184 and 186. The final laminate is then applied to a converter (not shown) wherein the laminate is applied to a release liner and passed through a rotary die which converts the laminate to discrete LC networks carried on a common carrier.

While the dielectric materials discussed hereinabove have primarily been suggested to be formed of corona treated polyethylene webs, similar dielectric materials typically utilized for capacitor dielectrics may be formed from webs of polypropylene having thicknesses in the range from 0.02 to 0.1 millimeter. Other non-conductive materials having requisite dielectric characteristics may be similarly utilized. Depending upon the capacitance desired in the ultimate laminate, the thickness of the dielectric sheets utilized in the present invention may typically be in the range of 1 to 4 mils (25-100 micrometers). Corona treated rolls of polyethylene are preferably provided as a coating on an underlying sheet of polyester. The polyester sheet is preferably removed prior to the second stamping operation, however, if desired to provide a harder surface to improve the shearing action, the polyester sheet may also be removed after the second stamping operation. Depending upon the resonant frequency or time constant required for the LC networks, other sheet thicknesses and materials having varying dielectric constants may similarly be utilized. Also, various metallic sheets may be utilized. While aluminum and copper foils may be preferred, both because of the high conductivities and low cost provided thereby, other formulations affording greater ease in punching, flexibility, or the like, may similarly be desired.

In some applications, it may be desired that the two planar inductors formed in the layers 72 and 74 shown in the exploded view of FIG. 2, have the respective windings spiralling in opposite directions, such that, for example, the windings in inductor formed by the layer 72 spiral inwardly in a counterclockwise direction, while the windings in the lower inductor formed by the layer 74 spiral inwardly in a clockwise direction. In such an embodiment, the discontinuous pattern created by the first punching operations, such as by the punch and die assemblies 14 and 42 in FIG. 1, may be identical, a single die thus possibly being used, the second layer 74 of FIG. 2 thus being provided merely by turning the second member upside down.

Having thus described the preferred embodiments of methods of making the substantially planar LC networks of the present invention and of the networks per se, it will be understood that changes may be made in the size, shape or configuration of the parts of circuits described herein without departing from the present invention as recited in the claims.

What is claimed is:

1. A method of constructing a substantially planar inductive-capacitive (LC) network comprising
    (a) applying a cutting means to a first surface of a conductive metallic sheet to cut therefrom a discontinuous, predetermined pattern, forming therein a multi-turn, essentially spiral-like configuration having a plurality of interconnecting regions between adjacent turns of the spiral-like configuration, which interconnecting regions add rigidity to the thus configured sheet, and in which burrs resulting from said cutting extend from the opposite surface of the metallic sheet, (b) forming a pre-laminate by laminating one surface of the configured sheet to one surface of a sheet of a dielectric material, (c) applying a second cutting means to said pre-laminate to cut from said pre-laminate another discontinuous predetermined pattern which includes most of the interconnecting regions between the adjacent turns, leaving in the configured metallic sheet at least one continuous portion of the spiral-like configuration with no interconnecting regions to thereby complete said multi-turn inductor, in which burrs resulting from said second cutting also extend from said opposite surface of the metallic sheet, while leaving a plurality of interconnecting regions in said dielectric sheet to provide rigidity to said pre-laminate, and (d) forming a final laminate by laminating a second metallic sheet to a dielectric layer overlying said first surface of said first metallic sheet, said second metallic sheet being aligned with the multi-turn inductor, the distributed capacitor thus formed by the aligned inductor and second metallic sheet and separating dielectric layer combining with the multi-turn inductor to provide said substantially planar LC network.

2. A method according to claim 1 comprising forming said pre-laminate by laminating a said sheet of dielectric material to said first surface of said first conductive metallic sheet, and applying said cutting means to the exposed surface of said sheet of dielectric material, such that burrs resulting from said second cutting extend from said opposite surface of the metallic sheet and away from said dielectric sheet.

3. A method according to claim 1, further comprising providing as said second conductive sheet another multi-turn inductor aligned with the other multi-turn inductor to form a distributed capacitor comprising the two aligned inductors together with the separating dielectric layer, which capacitor combines with the two inductors to provide said substantially planar LC network.

4. A method according to claim 3, further comprising providing said another multi-turn inductor according to the steps of (a) removing from said second conductive sheet a discontinuous predetermined pattern, forming therein a multi-turn, essentially spiral-like configuration having a plurality of interconnecting regions between adjacent turns of the spiral-like configuration, which interconnecting regions add rigidity to the thus configured sheet, (b) forming a second pre-laminate by laminating said configured sheet to a second dielectric sheet, and (c) removing from said second pre-laminate another predetermined pattern including most of the interconnecting regions between adjacent turns, leaving at least one continuous portion of the spiral-like configuration with no interconnecting regions.

5. A method according to claim 4, comprising forming said final laminate by directly laminating together said dielectric sheets.

6. A method according to claim 4, comprising laminating the exposed surface of each of said configured conductive sheets to opposite surfaces of an additional dielectric layer.

7. A method according to claim 1, further comprising the steps of (a) moving an elongated web of conductive material parallel to its length past a first cutting station, (b) cutting into a first surface of said web and removing a discontinuous predetermined pattern therefrom to provide said configured sheet, said burrs thus extending from the opposite surface thereof;

(c) moving an elongated web of a dielectric sheet material parallel to its length, adjacent one surface of the configured sheet, (d) joining together the facing surfaces of said adjacent sheets to form an elongated pre-laminate, (e) moving said elongated pre-laminate past a second cutting station, and (f) cutting into said pre-laminate and removing another discontinuous predetermined pattern therefrom to form said multi-turn inductor extending over at least a portion of said elongated laminate.

8. A method according to claim 7, further comprising severing said portion of said web containing said multi-turn inductor from the remainder of the elongated laminate.

9. An LC network made by the method of claim 1.

10. A method of constructing a substantially planar inductive-capacitive (LC) network comprising (a) forming two substantially planar multi-turn inductors, each inductor being formed by (i) removing from a conductive sheet a first discontinuous predetermined pattern, forming therein a multi-turn, essentially spiral-like configuration having a plurality of interconnecting regions between adjacent turns of the spiral-like configuration, which interconnecting regions add rigidity to the thus configured sheet, (ii) laminating said configured sheet to a dielectric sheet to form a pre-laminate, and (iii) removing from said pre-laminate another discontinuous predetermined pattern including most of the interconnecting regions between adjacent turns of the spiral-like configuration on the conductive sheet together with underlying portions of the dielectric sheet, leaving in the configured conductive sheet at least one continuous portion of the spiral-like configuration with no interconnecting regions to thereby form one of said planar multi-turn inductors while leaving in the dielectric sheet a plurality of interconnecting portions overlying the first removed pattern on the conductive sheet such that said pre-laminate is a substantially contiguous self-supporting body without extensive gaps therein, and (b) forming at least one capacitor by laminating together said two pre-laminates, at least one portion of the conductive, spiral-like configuration on each conductive sheet being substantially aligned with a portion of the spiral-like configuration on the other conductive sheet, but with the aligned portions being separated by a dielectric layer, the distributed capacitor thus formed by the aligned portions, and separating dielectric layer and the two inductors combining to provide said substantially planar LC network.

11. A method according to claim 10, comprising forming each of said multi-turn inductors by (a) die-cutting said discontinuous predetermined pattern from a conductive sheet, burrs resulting from said cutting extending from one surface of said configured sheet, (b) adhering said one surface of the configured sheet to a surface of a dielectric sheet to form a sub-laminate in which said burrs are embedded within said dielectric sheet, and (c) cutting said another discontinuous predetermined pattern from said sub-laminate, burrs resulting from the second cutting also being embedded within said dielectric sheet.

12. A method according to claim 10, comprising forming said at least one capacitor by directly laminating together said dielectric sheets.

13. A method according to claim 10, comprising forming said at least one capacitor by laminating the exposed surfaces of each of said configured conductive sheets to opposite surfaces of an additional dielectric sheet.

14. An LC network made by the method of claim 10.

15. A substantially planar, inductive-capacitive (LC) network comprising a laminate of two pre-laminates, each of which includes a conductive sheet one surface of which is laminated to a surface of a dielectric sheet, wherein the conductive sheet of each pre-laminate has an essentially spiral-like configuration resulting in a planar multi-turn inductor in which each turn is separated from adjacent turns by a removed spiral-like configuration, and wherein the dielectric sheet of each pre-laminate contains a plurality of discontinuous apertures overlying portions of said removed spiral-like configuration of the associated conductive sheet and the remaining interconnecting portions on each dielectric sheet overlie other portions of the removed spiral-like configuration of the associated conductive sheet such that each said pre-laminate is a substantially contiguous self-supporting body without extensive gaps therein, and wherein the multi-turn inductors of each pre-laminate are positioned in general alignment with each other on opposite sides of a dielectric layer to form the laminate, a distributed capacitor thus being formed by the multi-turn inductors and the dielectric layer therebetween, which capacitor combines with said multi-turn inductors to provide said substantially planar LC network.

16. An LC network according to claim 15, wherein said dielectric sheets of said pre-laminates are directly bonded together to provide said dielectric layer.

17. An LC network according to claim 15, wherein a separate dielectric sheet is provided between the multi-turn inductors of said pre-laminates.

* * * * *